June 17, 1969 D. MacKELLAR ET AL 3,450,534
TIN-LEAD-TIN LAYER ARRANGEMENT TO IMPROVE ADHERENCE OF
PHOTORESIST AND SUBSTRATE
Filed April 1, 1966
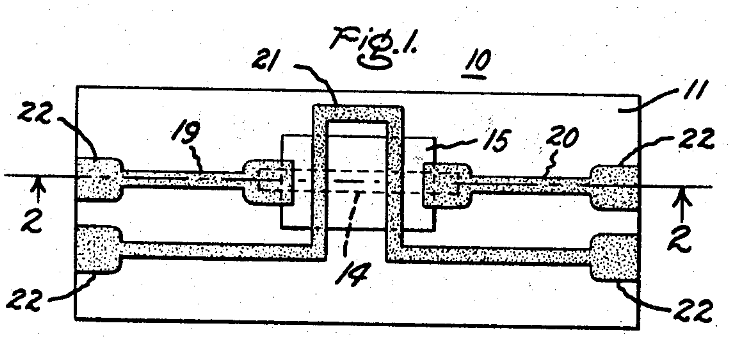
Fig. 2.
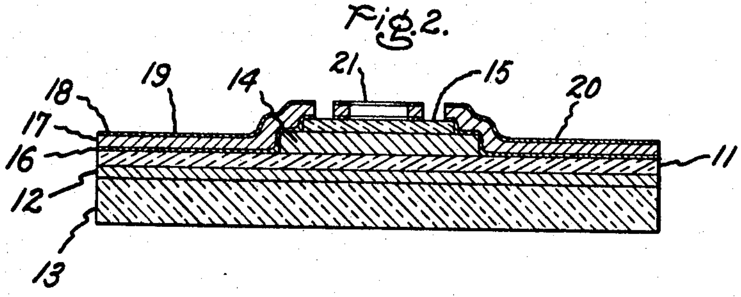
Inventors:
Donald MacKellar,
Reuben E. Joynson Jr.
by Marvin Snyder
Their Attorney.

United States Patent Office 3,450,534
Patented June 17, 1969

3,450,534

TIN-LEAD-TIN LAYER ARRANGEMENT TO IMPROVE ADHERENCE OF PHOTORESIST AND SUBSTRATE

Donald MacKellar and Reuben E. Joynson, Jr., Schenectady, N.Y., assignors to General Electric Company, a corporation of New York Filed Apr. 1, 1966, Ser. No. 539,491
Int. Cl. G03c 5/00; B44d 1/14
U.S. Cl. 96—36.2 8 Claims

ABSTRACT OF THE DISCLOSURE

In fabricating cryogenic circuitry, a thin film of tin is evaporated onto an evaporated lead film before applying a photoresist layer to the surface of the circuitry prior to patterning the lead film. This promotes adhesion of the resist and improves accuracy in etching the desired pattern. Since the thin film of tin does not oxidize, it facilitates making reliable soldered connections to the lead film. An additional thin film of tin applied to the substrate before evaporating the lead improves adherence of the lead film to the substrate and reduces breakage of soldered connections during temperature cycling of the circuitry.

This invention relates to cryogenic circuitry, and more particularly to a method of fabricating improved cryogenic circuit apparatus.

When fabricating evaporated films for cryogenic circuits, cryotrons, and continuous film superconductive memory devices, it is often necessary to obtain interconnections, controls, and drive lines by photoetching films of evaporated lead with an appropriate acid. This is normally a very rapid and convenient way of producing desired film patterns, since the alternative of depositing lead through a stencil mask allows the lead to spread beneath the mask, resulting in uneven edges of lead. However, one problem which has long plagued the photoetching process employed in the manufacture of such apparatus has been that adhesion of photoresist materials, such as KPR which is sold by Eastman Kodak Company, is poor when applied to the lead films. Thus, after the dried photoresist-coated lead film is exposed through a photomask to radiation of frequency suitable to polymerize the photoresist, and the unexposed photoresist is removed by developing, the poorly adherent photoresist comprising the pattern lifts at the edges during etching of the lead film. This results in undercutting by the etchant, and in some cases complete loss of photoresist during etching. The result is loss of the desired pattern.

Another problem arises when the photoresist material is removed after the etching operation. The lead film oxidizes upon exposure to atmosphere, making it difficult and sometimes impossible to make soldered connections or pressure connections to these oxidized lead films. Moreover, when lead films are cycled from room temperature to liquid nitrogen or liquid helium temperatures, and back again to room temperature, moisture condenses on the surface, causing rapid corrosion and ultimate disintegration of the circuit. Further, stresses due to this temperature cycling cause the soldered connections to break away from the film, due to poor adhesion of the lead to the underlying insulating materials, resulting in open circuits. The temperature cycling also results in stress-induced grain growth and recrystallization of the lead film, causing the lead film to develop short circuits between itself and other metal layers in the cryogenic device.

The present invention concerns a method of obviating the aforementioned problems in the manufacture of cryogenic circuit apparatus by achieving better adhesion of the photoresist materials so as to prevent lifting of the photoresist at the edges. This is accomplished by evaporating a tin film of a few hundred Angstroms thickness on top of the lead film, which may be from one-half to one micron in thickness, prior to deposition of the photoresist material thereon. Evaporation of the tin and lead are both accomplished in the same vacuum. Moreover, the lead film may be made more adherent to the underlying film or substrate by evaporating a tin film of a few hundred Angstroms thickness prior to deposition of the lead film in the same vacuum.

Accordingly, one object of the invention is to provide a method of fabricating cryogenic circuit apparatus having lead films of uniform edge acuity, by photoresist techniques.

Another object is to provide a method of fabricating cryogenic apparatus having lead films which may be easily soldered to and remain firmly soldered with repeated temperature cycling.

Another object is to provide a method of protecting lead films in cryogenic apparatus from oxidation in the atmosphere and at temperatures repeatedly varying between room temperatures and cryogenic temperatures.

Another object is to prevent short circuits in cryogenic apparatus between lead films and other metal layers thereon by inhibiting stress-induced grain growth and recrystallization of the lead films.

Briefly, in accordance with a preferred embodiment of the invention, there is provided a method of fabricating high quality lead films for cryogenic circuit apparatus by evaporating in a vacuum of film of tin onto a substrate, evaporating a predetermined one of the lead films onto the tin film in the vacuum, and evaporating a second film of tin onto the predetermined lead film. The thickness of each of the tin films is between one and two orders of magnitude less than the thickness of the predetermined lead films.

The features of the invention believed to be novel are set forth with particularity in the appended claims. The invention itself, however, both as to organization and method of operation, together with further objects and advantages, may best be understood by reference to the following description taken in conjunction with the accompanying drawings in which:

FIGURE 1 is a top view of a crossed film cryotron fabricated in accordance with the teachings of the invention; and FIGURE 2 is a sectional view of the cross film cryotron of FIGURE 1 as viewed along line 2—2 thereof.

In FIGURE 1, a cryogenic circuit component, such as a crossed film cryotron cell 10, is shown having an upper insulating layer 11 of silicon oxide deposited over a superconductive shield or ground plane 12, shown in FIGURE 2, which serves to reduce inductance of the cell circuitry so as to increase cell operating speed. This layer is generally comprised of a superconductor material having a high critical field; that is, a material which remains superconducting even in the presence of relatively high magnetic flux densities. Ground plane 12 is assumed to consist essentially of niobium, although lead is also a superconductor material well-suited for use as a ground plane. The ground plane is generally deposited over an insulating substrate, such as glass 13, shown in FIGURE 2.

Deposited over ground plane 12, as shown in FIGURE 1, is a gate superconductor 14. This superconductor layer is generally comprised of a "soft" superconductor material; that is, a material which switches from its superconducting to its normal or resistive state in the presence of relatively low magnetic flux densities. The gate superconductor material is assumed to consist essentially of tin, and may be evaporated onto silicon oxide layer 11 through a mask, or otherwise deposited through a stencil.

Overlaid on gate superconductor 14 is a layer of insulation 15, such as silicon oxide, which serves to electrically isolate the gate and control superconductors. A film of tin 16 having a thickness preferably in the range of 100–200 Angstrom units is evaporated onto the entire upper surface of silicon oxide layer 15, the exposed portion of gate superconductor 14, and the exposed portion of silicon oxide layer 11. A layer of lead 17, having a thickness preferably in the range of one-half to one micron, is evaporated onto the entire surface of tin film 16, and another layer of tin 18 also having a thickness in the range of 100–200 Angstrom units is evaporated onto the entire surface of lead film 17. These layers of tin and lead are visible in cross section in FIGURE 2. It should be noted that films 16, 17 and 18 are evaporated in sequence while circuit component 10 remains within a vacuum chamber at a substantially invariant pressure. Evaporation of the tin and lead films in the same vacuum inhibits formation of oxides between the tin and lead layers. It should also be noted that silicon oxide layer 15 coats less than the entire upper surface of gate 14, permitting tin film 16 to make electrical contact with gate 14 at either end thereof.

In order to produce the desired pattern or configuration of lead film on component 10, tin film 18 is coated with a layer of photoresist, such as Eastman Kodak KPR, and allowed to dry. A photomask having the desired pattern, such as illustrated by the shaded regions in FIGURE 1, is next applied to the upper surface of the photoresist, and the exposed regions of the photoresist are subjected to radiation of frequency suitable to polymerize the photoresist. This radiation includes ultraviolet. The unexposed regions of the photoresist are then dissolved in a suitable solvent such as Eastman Kodak KPR Developer, so that only the exposed regions of the photoresist, which are identical in shape and area to the transparent regions of the photomask remain. Subsequent etching of the upper surface of apparatus 10 with a dilute solution of acetic acid and hydrogen peroxide removes those portions of lead film 17 and their coatings of upper and lower tin films 18 and 16 respectively, which are not coated with photoresist. Thus, a pattern in the shape of the shaded regions of FIGURE 1 and comprised of lead film coated with tin film on each of its upper and lower surfaces, remains after the exposed regions of the photoresist material have been removed by dissolving them in an appropriate solvent, such as tetrahydrofuran. This pattern is in the form of a pair of connectors 19 and 20 making electrical contact with either end of gate superconductor 14, and a control superconductor 21 directed at right angles to, and in magnetic proximity with, gate superconductor 14. The widths of the tin-coated lead film are increased at the edges of apparatus 10, as indicated by regions 22, for the purpose of providing sufficient area to make good, soldered electrical contact thereto.

Due to the excellent adhesion of the photoresist material to tin film 18, the etching solution cannot penetrate beneath the applied layer of exposed photoresist material. Hence, the pattern illustrated by the shaded regions in FIGURE 1 has very sharply defined edges, resulting in a high quality device.

It should be noted that current flow through the tin-coated lead film occurs mainly through the lead region. Hence, even if the tin coating should switch from its superconducting to its normal state, resistance to current flow in the composite lead-tin film is not materially reduced, since the lead remains in its superconducting condition, as is characteristic of a hard superconductor. Therefore, no degradation in electrical performance of component 10 occurs as a result of the tin coating. Further, it has been found that a thin film of tin interposed between the lead film and insulation layer 11 improves adhesion of the lead film to the insulation layer. It has also been determined that a thin coating of tin on lead films of a cryogenic device inhibits formation of short circuits between the lead films and other metal layers thereon.

When soldered connections are made to the various segments of tin-coated lead film 17 at widened regions 22, the solder is in direct contact with the tin film; that is, the tin film has essentially no oxide layer thereon. This results in connections to the lead film having greater mechanical strength and lower electrical resistance than if the soldered connections were made directly to the lead film, since the high susceptibility of lead to oxidation would result in interpositioning of a lead oxide layer between the lead film and the solder. This lead oxide film would inhibit adhesion of the solder to the lead. Moreover, oxidation of lead is enhanced by repeated temperature cycling between room temperature and liquid nitrogen or liquid helium temperature, as commonly occurs in cryogenic apparatus, due to condensation of moisture on the surface of the layer. Hence, tin, which does not oxidize as readily as lead, provides a vast improvement in quality of cryogenic apparatus when it is applied to lead films as a thin coating thereon.

The foregoing describes a method of fabricating cryogenic circuit apparatus having lead films of uniform edge acuity, by photoresist techniques. This method permits fabrication of cryogenic apparatus having lead films which may be easily soldered to and remain firmly soldered with repeated temperature cycling. This process also protects lead films in cryogenic apparatus from oxidation in the atmosphere and at temperatures repeatedly varying between room temperatures and cryogenic temperatures. The process further serves to prevent formation of short circuits in cryogenic apparatus between lead films and other metal layers utilized therein.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What we claim as new and desire to secure by Letters Patent of the United States is:

1. In the manufacture of electronic apparatus for use at cryogenic temperatures, said apparatus having at least one lead film thereon, the method of improving electrical and mechanical characteristics of said lead film comprising: evaporating in a vacuum a film of tin onto a substrate of said apparatus; evaporating said lead film onto said tin film in said vacuum; and evaporating a second film of tin onto said lead film in said vacuum, the thickness of each of said tin films being maintained between one and two orders of magnitude less than the thickness of said lead film.

2. The method of claim 1 further comprising: coating the exposed surface of said second film of tin with photoresist material; exposing said coating of photoresist material to radiation of predetermined frequency through a mask of a predetermined pattern; removing the unexposed regions of photoresist material; and removing with an acid etch the portions of said lead and tin films in said areas unprotected by said photoresist material to leave said etched regions with sharp and distinct boundaries.

3. The method of claim 2 further comprising removing the exposed regions of photoresist material after said portions of said lead and tin films have been etched.

4. In the manufacture of electronic apparatus for use at cryogenic temperatures, said apparatus having at least one lead film thereon, the method of improving electrical and mechanical characteristics of said lead film comprising: applying said lead film to a substrate in a non-oxidizing environment, and coating said lead film within said environment with a thin film of tin.

5. The method of claim 4 wherein the step of applying said lead film to a substrate comprises evaporating said lead film onto said substrate.

6. The method of claim 5 wherein the step of coating said lead film with a thin film of tin comprises evaporating said tin film onto said lead film.

7. The method of claim 4 wherein said coating step includes coating both the upper and lower surfaces of said lead film with a thin film of tin.

8. The method of claim 4 further comprising: coating the exposed surface of said film of tin with photoresist material; exposing said coating of photoresist material to radiation of predetermined frequency through a mask of a predetermined pattern; removing the unexposed regions of photoresist material; and removing with an acid etch the portions of said lead and tin films in said areas unprotected by said photoresist material to leave said etched regions with sharp and distinct boundaries.

References Cited

UNITED STATES PATENTS

| | | | |
|---|---|---|---|
| 3,125,654 | 3/1964 | Arnold | 117—217 XR |
| 3,366,519 | 1/1968 | Pritchard Jr., et al. | 96—36.2 |

NORMAN G. TORCHIN, *Primary Examiner.*

J. R. EVERETT, *Assistant Examiner.*

U.S. Cl. X.R.

29—194; 117—71, 217